United States Patent [19]

Cohen et al.

[11] 4,008,343

[45] Feb. 15, 1977

[54] PROCESS FOR ELECTROLESS PLATING USING COLLOID SENSITIZATION AND ACID RINSE

[75] Inventors: Richard Lewis Cohen, Berkeley Heights, N.J.; Ronald Lee Meek, Naperville, Ill.

[73] Assignee: Bell Telephone Laboratories, Incorporated, Murray Hill, N.J.

[22] Filed: Aug. 15, 1975

[21] Appl. No.: 605,068

[52] U.S. Cl. .............................. 427/305; 427/306; 427/98

[51] Int. Cl.² .......................................... B05D 3/10

[58] Field of Search ..................... 427/306, 305, 98; 156/3

[56] References Cited

UNITED STATES PATENTS

| | | | |
|---|---|---|---|
| 3,011,920 | 12/1961 | Shipley, Jr. ....................... | 427/98 X |
| 3,532,518 | 10/1970 | D'Ottavio ............................. | 106/1 |
| 3,562,038 | 2/1971 | Shipley, Jr. et al. ............. | 427/98 X |
| 3,767,583 | 10/1973 | Fadgen, Jr. et al. ............... | 106/1 X |

Primary Examiner—Ralph S. Kendall
Assistant Examiner—Charles R. Wolfe, Jr.
Attorney, Agent, or Firm—Walter G. Nilsen

[57] ABSTRACT

A process is described for the electroless deposition of metals on nonmetallic surfaces. The process involves pretreatment of the nonmetallic surface so as to obtain a surface finish suitable for deposition of colloidal sensitizers which catalyze electroless metallic deposition. The nonmetallic surface is then exposed to a colloidal catalyst solution (typically $SnCl_2/PdCl_2$) followed by an acid rinse. On completion of this surface activation procedure, the surface is exposed to a bath for the electroless deposition of metal. This procedure, which differs from that traditionally used, insures more reliable catalysis for electroless deposition of metals with shorter initiation times and is simpler in procedure and lower in cost.

10 Claims, 1 Drawing Figure

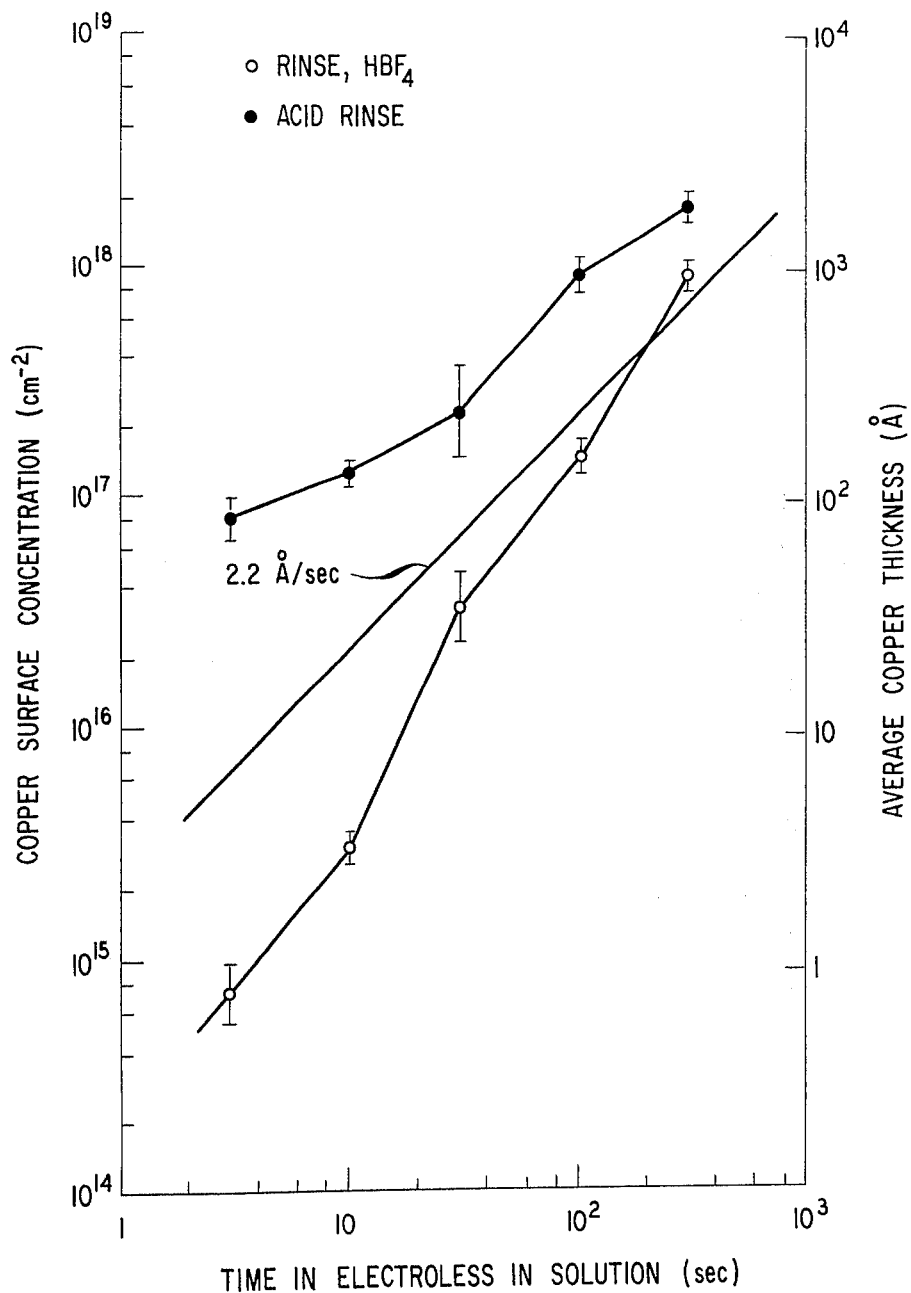

PROCESS FOR ELECTROLESS PLATING USING COLLOID SENSITIZATION AND ACID RINSE

BACKGROUND OF THE INVENTION

1. Field of the Invention

The invention is a process for the electroless deposition of metals on nonmetallic surfaces. It involves in particular the sensitization of the nonmetallic surface for electroless deposition.

2. Description of the Prior Art

Electroless deposition of metals on nonmetallic surfaces has increased in importance in recent years because of the extensive use of such electroless deposition processes in the manufacture of printed wiring boards and related articles for use in the manufacture of electronic circuits. Electroless deposition of metals is also used for decorative plating of plastics such as for automobile parts, consumer appliances, etc. Inexpensive and reliable processes for carrying out such a procedure are in great demand. It is highly desirable from an economic point of view to develop processes for electroless plating of metal on nonmetallic surfaces which are less expensive, simpler to carry out and highly reliable. For applications relating to the fabrication of electronic circuits, good control over the deposition process is often required. For example, rapid and uniform initiation of electroless deposition assures more uniform deposition of metal which is highly advantageous for printed circuit boards to be used in electronic circuit fabrication.

A difficulty in electroless plating on nonmetallic surfaces is the preparation so as to make it catalytic for the electroless deposition process. A variety of processes have been used as evidenced by the references cited below. Particularly important is the so-called one-step process in which the sensitizer (such as $SnCl_2$) and activator (such as $PdCl_2$) are combined into a single solution. This type of catalytic process has the advantage of producing more active surfaces for electroless plating of metal.

The entire process of catalytic activation of dielectric surfaces using the single bath sensitizer and activator has been discussed in some detail by Rantell and Holtzman ("Role of rinsing during the activation of abs plastic using mixed $SnCl_2/PdCl_2$ catalysts," by A. Rantell and H. Holtzman, *Electroplating and Metal Finishing*, Vol. 27, No. 2, February 1974, pp. 15–20 cited hereafter as Rantell I.). First the dielectric surface is physically prepared for exposure to the catalytic solution either by abrasion or etching. Some surfaces may already be in a condition suitable for sensitization and need not undergo any physical or chemical surface preparation. The surface is then cleaned, usually by a water wash and exposure to hydrochloric acid. The surface is then exposed to a mixed sensitizer/activator solution called here a colloidal catalyst solution. Thereafter, the surface is rinsed in water to remove excess colloidal catalyst solution and to fix colloidal catalyst on the surface. Next, the surface is exposed to an accelerator solution. After another water rinse, the surface is exposed to the electroless plating solution and after completion of electroless plating may again be exposed to a water wash.

The accelerator solution may consist of a variety of solutions, including dilute acids and bases. Typical acids are sulfuric acid, perchloric acid (see *Plating on Plastics* by Muller et al., Robert Draper LTD, Teddington, 1971, Second Edition, Chapter 11, especially page 87), hydrochloric acid (see "Electron Miscroscope Investigation of Mixed Stannic Chloride/Palladium Chloride Catalysts for Plating Dielectric Substrates" by N. Feldstein et al., *Journal of the Electrochemical Society.*, 121, 738 (1974)), and fluoboric acid (see U.S. Pat. No. 3,532,518 issued October 6, 1970 to E. D. D'Ottavio, "Mechanism of Activation of Polymer Surfaces by Mixed Stannous Chloride/Palladium Chloride Catalysts" by A. Rantell and H. Holtzman, *Transactions of the Institute of Metal Finishing, IMF* 51, 62 (1973) cited hereafter as Rantell II). Other accelerator solutions used are $NH_4HF_2$ and NaOH, disclosed in the Rantell I cited above.

Rantell and Holtzman (in the Rantell I reference) have emphasized the importance of water rinsing in the catalytic activation process. They show by way of comparative experiments that the elimination of the water rinse either after the sensitization step or after the acceleration step drastically reduces the catalytic activity of the activated surface. They also show by way of the same experiments, that the elimination of both water rinses also drastically reduces the catalytic activity of the surface. They also point out in the same reference that extensive water rinsing is necessary to prevent colloid material from the sensitization bath from getting into the accelerator bath. This produces clumps of colloidal catalyst material in the acceleration bath which under usual manufacturing conditions often gets on the surface being sensitized. This produces excessive surface roughness after electroless metal deposition. Also, dragging accelerator solution into the electroless deposition bath causes breakdown of this bath due to the presence of palladium catalyst particles.

In commercial electroless deposition processes it is highly desirable to simplify the procedure. Particularly desirable is the reduction in the number of successive steps and the increase in the reliability of the process. For example, reduction of the initiation time would lead to a more uniform metal deposition which is particularly desirable in the production of metallized surfaces in the fabrication of electronic circuits.

SUMMARY OF THE INVENTION

The invention is a process for the electroless deposition of copper or nickel involving a precise procedure with fewer steps than the processes conventionally used. Initially, the nonmetallic surface is physically prepared using for example cleaning and/or an etching procedure. This is called preconditioning of the surface. The surface is then exposed to the colloidal catalyst solution which consists essentially of stannous salt and palladium salt (for example, $SnCl_2PdCl_2$). The surface is then rinsed with an acid solution to complete preparation of the surface for electroless deposition. This acid rinse is carried out with an aqueous solution of an acid with pH less than 1.5. On completion of the acid rinse, the surface may be washed with water to prevent acid from going into the electroless plating bath. Various acids may be used in the aqueous acid rinse including hydrochloric acid, perchloric acid, and nitric acid. A pH of less than 1.0 is preferred because the surface exhibits greater catalytic activity when rinsed in a more acid solution. Greatest catalytic activity is achieved with the pH less than 0.5. Also, hydrochloric acid is preferred because of its compatibility with other solutions in the electroless deposition process and because of its low cost. It is also believed that hydrochloric acid is somewhat more efficient because of possible complexing action of the chloride ions.

BRIEF DESCRIPTION OF THE DRAWING

The FIGURE is a graph, showing coordinates of plating thickness in atoms/cm$^2$ and average thickness vs. time in the electroless bath, the rate of plating using the inventive procedure and conventional procedure.

DETAILED DESCRIPTION

The invention involves a specific procedure for the electroless deposition of copper or nickel on nonmetallic surfaces. This procedure for convenience can be divided into a sequence of parts as follows:

a. physical and chemical preconditioning of the surface so as to permit good adhesion of the catalyst and metal plating to the surface;

b. application of the colloidal catalyst solution to the prepared surface;

c. acid rinse of the surface;

d. water rinse to remove the acid rinse;

e. electroless deposition of copper or nickel on the catalytically prepared surface.

The particular procedures to be used in the preconditioning of the surface to be plated depends largely on the exact nature of that surface. The purpose of this part of the electroless deposition process is to physically and chemically prepare the surface for the colloidal catalyst solution so as to insure good adhesion of the electroless plating to the surface. Generally, this preconditioning procedure involves a cleaning step to remove organic contaminants from the surface and an etching step to provide some amount of roughening of the surface and to prepare the surface chemically for the colloidal solution.

A particular procedure for an epoxy surface will serve to illustrate this part of the electroless deposition process. This type of procedure is usually called a swell-etch procedure. Here a solvent which is highly absorbed by the surface (e.g., methylethylketone, furan) is used to swell the surface. After swelling, an acid etch solution (e.g., chromium trioxide and sulfuric acid) is used to etch the surface. Generally the etching step is carried out at elevated temperatures (50°–100° C) and a water rinse is used between swelling and etching steps and after the etching step.

Other surface treatments have been described in a book by John McDermott (Plating of Plastics with Metals, Noyes Data Corp., Park Ridge, N.J., 1974, especially chapter 1) and a book by William Goldie (Metallic Coating of Plastics, Electrochemical Publications Limited, 1968, Vol. I and II).

Electroless metal plating is often used in the fabrication of electronic circuits to electrically connect two conducting paths on opposite surfaces of the circuit board through a hole in the circuit board. Under these circumstances the preconditioning procedure is usually somewhat different from that used to prepare a nonconducting surface. Where electrical connection is to be effected, the nonconducting surface should be preconditioned and metal surface cleaned to effect good electrical contact with deposited metal. A typical preconditioning procedure used in this instance is outlined below:

a. The surface to be plated is dipped into a detergent solution such as alkaline buffered phosphate or neutral pH cleaner to remove the oxide on the metal (generally copper) already on the circuit board. The time in which the surface is exposed to the detergent solution may vary over large limits but a time of 2 to 4 minutes is preferred because the benefits of the detergent solution are fully obtained in this time and longer exposure would be wasteful of time. Similar reasons obtain for the preferred times given below. The surface is then washed with water to remove the detergent.

b. The surface is then exposed to a wetting agent such as alkyl aryl polyether or certain alcohols. This step is often carried out at elevated temperatures, usually between 50° and 100° C. The preferred time of exposure varies between 5 and 15 minutes. The surface is then washed with water to remove the wetting agent.

c. The surface in then exposed to a solution of ammonium persulfate (generally a concentration of approximately 180 grams per liter) at a temperature between 25° and 40° C for a time preferably between 1 and 2 minutes. The surface is then washed with water to remove the ammonium persulfate solution.

d. The surface is then exposed to a solution of ten percent by volume of concentration sulfuric acid at room temperature for a time preferably between 2 and 4 minutes. The surface is again washed with water.

e. The surface is then exposed to a solution of forty percent by volume of concentrated hydrochloric acid for a time preferably between 2 and 4 minutes. The surface at this point is not washed with water but is directly exposed to the catalyst solution.

2. Treatment With Colloidal Metal Catalyst

After pretreatment of the surface, the surface to be plated is immersed in a colloidal palladium catalyst solution. This catalyst solution may be prepared in a variety of ways, some of which have been described in two references. The first reference in U.S. Pat. No. 3,011,920 issued to C. R. Shipley, Jr. on Dec. 5, 1961. The second reference is to U.S. Pat. No. 3,532,518 issued to Eugene D. D'Ottavio on Oct. 6, 1970. A particular example of catalyst solution preparation is as follows: two grams of palladium chloride are dissolved in 200 milliliters of concentrated hydrochloric acid and 400 milliliters of pure water. On complete dissolution of the palladium chloride 4 grams of anhydrous stannous chloride are added to the solution. After mixing this first solution it is added to a second solution containing 96 grams of anhydrous stannous chloride, 14 grams of sodium stannate and 400 milliliters of concentrated sulfuric acid. The catalytic properties of this solution may be increased by heating it to 120° to 150° F for about 3 hours.

3. The Acid Rinse

Particularly important to the practice of the invention is that the surface exposed to catalytic solution as described above is next washed with an acid solution with pH less than 1.5. Exposure of the treated surface to an aqueous solution (or water) with pH greater than 1.5 should be avoided until after the acid rinse. Various acid solutions may be used, including hydrochloric acid, perchloric acid and nitric acid. A pH of less than 1.0 is preferred because of greater catalytic activity exhibited under these circumstances. Also, hydrochloric acid is generally preferred for a variety of reasons: This acid is used in other solutions used in the process and therefore will minimize outside contamination. On evaporation no residue remains, which minimizes surface contamination. It is low in cost. It maintains the chloride complexing of the tin ions, which probably facilitates their removal. Chloride salts are usually used in this process and use of a chloride acid minimizes possible complications which might arise from introducing another ion. Rinse times are not especially critical. It is preferred that rinse times be between one and 30 minutes. Rinse periods beyond 30 minutes do not usually produce further improvement, and less than one minute might leave some areas of the surface with long initiation times for electroless deposition. A time of 3–6 minutes has resulted in short, uniform initiation of electroless plating.

It is believed that the beneficial results of this electroless deposition procedure arise from the fact that the post-catalyst acid rinse prevents precipitation of tin compounds which cover the palladium colloidal particles, inhibit their catalytic effectiveness. These precipitated tin compounds are difficult to remove from the palladium surface.

The surface is now exposed to a water rinse to remove soluble and loose substances such as the acid used in the acid rinse. This is done largely to prevent contamination of the electroless metal plating solution. Where contamination might not be a problem, as for example, where the acid used in the rinse is the same as used in the electroless bath, the water rinse might not be required. Typical wash times are 1–15 minutes but the times are not critical.

4. Electroless Deposition of Copper or Nickel on the Catalytically Prepared Surface The electroless deposition of copper or nickel is carried out using conventional electroless baths. A great variety of bath compositions and procedures may be used. Some of these are outlined in the William Goldey reference cited above, especially chapters 6 and 7, and the John McDermott reference, especially pages 62 to 114.

A typical electroless copper solution contains a copper salt such as copper sulfate, a complexing agent such as disodiumethylenediaminetetracetate, a reducing agent such as formaldehyde, and sufficient base such as alkali-metal hydroxide to obtain a pH of at least 11. Typical concentrations used are: between 0.002M to 0.15M for the copper salt; from 0.003M to 1M for the compexing agent; and from 0.02M to 2M for the reducing agent. The time that the surface should be exposed to the electroless plating solution may vary over large limits depending generally on plating conditions and thickness desired. Plating times as short as 10 seconds are often sufficient to obtain the required thickness so that electrolytic copper deposition may be used to increase thickness. Times exceeding one hour are usually not profitable because the increase in plating obtained in this time range is usually not particularly profitable. Another copper plating solution is given in the Shipley reference cited above.

Nickel electroless plating solutions are also described in the two books cited above and in the Shipley reference. Generally these nickel electroless baths contain a nickel solution such as nickel chloride, a reducing agent such as sodium hypophosphite, and citrate ion combined with the nickel.

5. Comparison of Traditional and Inventive Processes

In order to show the advantage of the inventive processes over traditional processes used for electrolessly plating copper and nickel, comparative experiments were carried out. In one set of experiments the nonmetallic surface was first exposed to the catalytic colloid solution for a period of 5 minutes, then rinsed in water for 1 minute, then exposed to an accelerator solution containing fluoboric acid for a period of 5 minutes and then rinsed in water for 1 minute. This surface was then exposed to a conventional electroless copper bath for various times and the thickness and surface concentration of copper atoms was measured. This procedure corresponds to that traditionally used at the present time. The results of these experiments are shown in the lower curve of the FIGURE.

By way of comparison, like surfaces preconditioned in the same way were also exposed to the same catalytic colloid solution for the same amount of time. Here instead of exposing the surface to a water rinse, it was rinsed with 50 percent aqueous hydrochloric acid for 5 minutes. No accelerator solution was used, but the surface was rinsed in water for 1 minute after the acid rinse. These surfaces were then exposed to the same conventional electroless copper bath as above for various times and the thickness and surface concentration of copper was measured. These data are also given in the FIGURE. Also shown in the FIGURE for comparison is a line which corresponds to a plating rate of 2.2 Angstroms per second.

Comparison of the two sets of data using the conventional procedure and the inventive procedure shows that plating using the acid rinse is much more rapid than that using the water rinse and accelerator solution. It is particularly interesting to note that a large part of the difference in plating rates is due to the much shorter initiation time exhibited when the inventive process is used. For example, after just 3 seconds the plating thickness using the inventive rinse procedure is 90 Angstroms whereas the thickness using the conventional procedure is only 1 Angstrom. Similarly, after 10 seconds the plating thickness using the inventive procedure is 150 Angstroms, whereas that using the conventional procedure is 4 Angstroms. These results show not only that the inventive procedure yields more rapid plating, but also that the initiation time is much shorter and should lead to more uniform plating.

What is claimed is:

1. A process for electroless deposition of metallic substances on nonmetallic surfaces suitable for electroless metal plating in which the metallic substances are selected from the group consisting of copper and nickel and in which the process comprises the steps of
    a. preconditioning the nonmetallic surface so as to prepare the surface for a colloidal catalyst solution;
    b. exposing the preconditioned surface to a colloidal catalyst solution consisting essentially of an aqueous solution of tin and palladium ions so as to produce a catalytically prepared surface containing catalyst;
    c. rinsing the catalytically prepared surface;
    d. exposing the catalytically prepared surface to an electroless plating solution so as to electrolessly plate the metallic substance on the catalytically prepared surface wherein the improvement lies in the rinsing of the catalytically prepared surface which is carried out using an aqueous acid solution with pH less than 1.5, said aqueous acid solution consisting essentially of water and an acid selected from the group consisting of hydrochloric acid, perchloric acid and nitric acid, and this rinsing step is carried out immediately after application of the colloidal catalyst solution without exposing the surface to an aqueous solution with pH greater than 1.5 and in addition is carried out under conditions which insures that the catalyst substantially remains on the surface.

2. The process of claim 1 in which the acid rinse step is followed by a water rinse prior to exposing the catalytically prepared surface to the electroless plating solution.

3. The process of claim 1 in which the pH of the aqueous acid solution in less than 1.0.

4. The process of claim 3 in which the pH of the aqueous acid solution is less than 0.5.

5. The process of claim 1 in which the aqueous acid solution contains at least one acid selected from the group consisting of hydrochloric acid, perchloric acid, and nitric acid.

6. The process of claim 1 in which the colloidal catalyst solution consists essentially of an aqueous solution of tin chloride and palladium chloride.

7. The process of claim 1 in which the electroless plating solution consists essentially of 0.002M to 0.15M copper salt, 0.003M to 1M complexing agent which complexes with copper ions supplied by the copper salt so as to stabilize the copper electroless plating solution and 0.02M to 2M reducing agent which supplies the chemical force to electrolessly plate copper onto the catalytically prepared surface.

8. The process of claim 7 in which the complexing agent is disodiumethylenediaminetetracetate.

9. The process of claim 7 in which the reducing agent is formaldehyde.

10. The process of claim 1 in which additional metallic substance is plated on the surface by electrolytic deposition after the electroless plating step.

* * * * *